United States Patent
Kim et al.

(10) Patent No.: US 7,800,964 B2
(45) Date of Patent: Sep. 21, 2010

(54) WAFER BURN-IN TEST CIRCUIT (75) Inventors: Youk-Hee Kim, Ichon (KR); Sun-Mo An, Ichon (KR)

(73) Assignee: Hynix Semiconductor Inc. (KR)

( * ) Notice: Subject to any disclaimer, the term of this patent is extended or adjusted under 35 U.S.C. 154(b) by 128 days.

(21) Appl. No.: 12/179,491

(22) Filed: Jul. 24, 2008

(65) Prior Publication Data
US 2009/0046525 A1    Feb. 19, 2009

(30) Foreign Application Priority Data
Aug. 14, 2007    (KR)    .................. 10-2007-0081553

(51) Int. Cl.
G11C 7/00    (2006.01)
G11C 29/00    (2006.01)
(52) U.S. Cl. ...................... 365/201; 365/222
(58) Field of Classification Search .............. 365/201, 365/222, 194
See application file for complete search history.

(56) References Cited

U.S. PATENT DOCUMENTS

| | | | |
|---|---|---|---|
| 5,936,899 A | 8/1999 | Jeong | |
| 6,266,286 B1 | 7/2001 | Cho et al. | |
| 6,570,796 B2 | 5/2003 | Sung | |
| 6,614,704 B2 * | 9/2003 | Dobler et al. | 365/222 |
| 6,711,077 B2 | 3/2004 | Sung | |
| 6,762,967 B2 * | 7/2004 | Tanizaki et al. | 365/201 |
| 6,819,134 B2 | 11/2004 | Jang | |
| 6,912,169 B2 * | 6/2005 | Choi | 365/222 |
| 6,996,753 B2 | 2/2006 | Cho | |

FOREIGN PATENT DOCUMENTS

| | | |
|---|---|---|
| JP | 2005-303163 | 10/2005 |
| KR | 1991-0020730 | 12/1991 |
| KR | 1994-0006150 | 3/1994 |
| KR | 1995-014099 | 11/1995 |
| KR | 10-0279239 | 12/2000 |
| KR | 10-0302617 | 7/2001 |
| KR | 1020060119066 | 11/2006 |
| KR | 1020070002838 | 1/2007 |

* cited by examiner

*Primary Examiner*—Anh Phung
(74) *Attorney, Agent, or Firm*—Baker & McKenzie LLP (57) ABSTRACT

A wafer burn-in test circuit includes an address toggle signal generating unit for generating an address toggle signal in response to address signals having a constant time period, a reset signal generating unit for receiving a wafer burn-in mode activation signal, the address signals, and a reset determination signal among the address signals and then generating a reset signal, a refresh test mode signal generating unit for receiving the address toggle signal and the reset signal and then generating a refresh test mode signal, and a refresh period signal generating unit for receiving the address toggle signal and the refresh test mode signal and then generating a refresh period signal.

24 Claims, 5 Drawing Sheets

WAFER BURN-IN TEST CIRCUIT

CROSS-REFERENCES TO RELATED APPLICATION

The present application claims priority under 35 U.S.C. 119(a) to Korean application number 10-2007-0081553, filed on Aug. 14, 2007, which is incorporated herein by reference in its entirety as if set forth in full.

BACKGROUND

1. Technical Field

The embodiments described herein relate to a test circuit and, more particularly, to a wafer burn-in test circuit capable of using a dynamic stress.

2. Related Art

Generally, a burn-in test process, which screens a device failure at an early stage, is carried out after manufacturing a semiconductor memory device. A conventional burn-in test is performed to improve the reliability of the semiconductor memory device.

In more detail, the burn-in test is often used as a screen test to sort a bad device at an early stage. The burn-in test can be classified into a wafer burn-in test carried out in a wafer state and a package burn-in test carried out in a package state.

The wafer burn-in test is carried out by applying stress to word lines over a predetermined time under the condition of high temperature and high voltage, after activating the word lines in memory cells. That is, this is a test to verify a latency defectiveness, which can be caused at an early stage when a stress is applied to memory cells. However, this wafer burn-in test has a problem in that it is difficult to screen the defectiveness effectively at an early stage. Namely, similar to the package burn-in test, it is also required to apply a dynamic stress to a memory cell in the worst condition in a wafer bur-in test mode.

SUMMARY

A wafer burn-in test circuit capable of applying a dynamic stress by producing a refresh period signal in a wafer burn-in test mode is described herein.

In one aspect, a wafer burn-in test circuit comprises an address toggle signal generating unit configured to generate an address toggle signal in response to address signals having a constant time period, a reset signal generating unit configured to receive a wafer burn-in mode activation signal, the address signals, and a reset determination signal among the address signals and to then generate a reset signal, a refresh test mode signal generating unit configured to receive the address toggle signal and the reset signal and to then generate a refresh test mode signal, and a refresh period signal generating unit configured to receive the address toggle signal and the refresh test mode signal and to then generate a refresh period signal.

In another aspect, a wafer burn-in test circuit comprises a refresh period signal generating unit configured to generate a refresh period signal in response to an address toggle signal while a refresh test mode signal is activated, by receiving the address toggle signal, which is in response to address signals having a time period, and the refresh test mode signal to define a refresh test mode section in response to the address toggle signal.

In still another aspect, a wafer burn-in test circuit comprises a wafer burn-in test mode block configured to define an activation section of a refresh test mode signal by combining an address toggle signal having a constant time period and a reset signal that is preset to reset a test mode, and a refresh period signal generating unit configured to generate a refresh period signal in response to a time period of the address toggle signal in the activation section of the refresh test mode signal and to generate the refresh period signal in response to a normal refresh period, which corresponds to a refresh command, in an inactivation section of the refresh test mode signal.

In still another aspect, a wafer burn-in test circuit comprises a refresh period signal generating unit configured to control word lines in such a manner that active and precharge operations are repeatedly carried out by using an address toggle signal generated in response to address signals having a constant time period in a wafer burn-in mode.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

According to the embodiments described herein, a refresh period signal can be produced in a wafer burn-in mode. That is, a section in which the refresh period is activated is created by using an address toggle signal that is periodically generated for a predetermined time and an active precharge state of word lines are repeated in all banks by using the refresh period signal that is generated with the time period of the address toggle signal during a predetermined active section. Since a dynamic stress can be applied to the word lines in a wafer burn-in test by using a simple method to produce the address toggle signal, semiconductor memory device failure can be effectively screened at an early stage.

Figure 1:
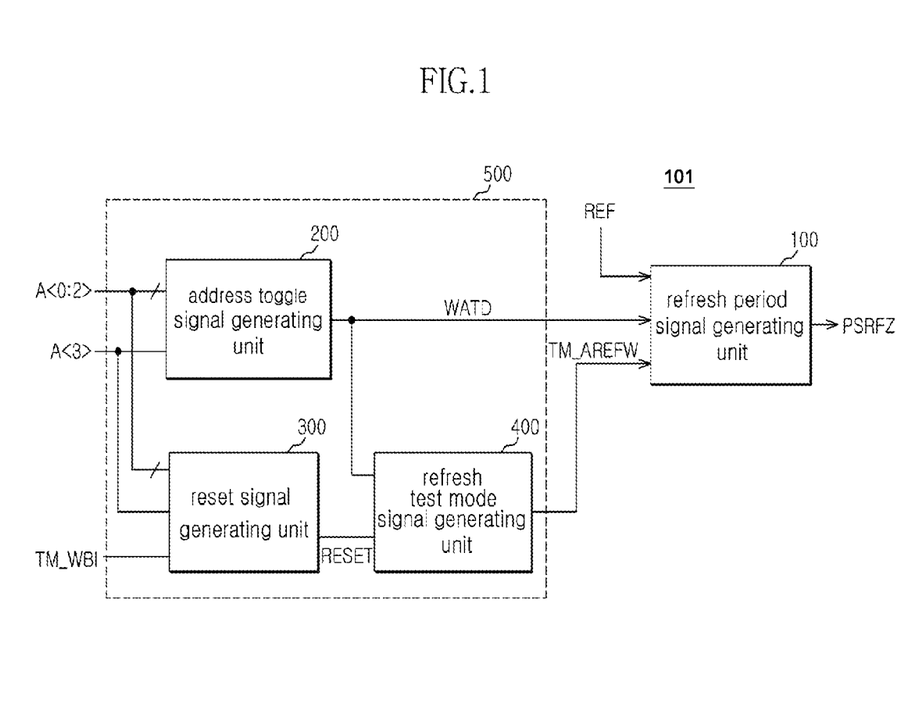
FIG. 1 is a conceptual block diagram illustrating a wafer burn-in test circuit according to one embodiment.

FIG. 1 is a block diagram illustrating a wafer burn-in test circuit 101 according to one embodiment. Referring to FIG. 1, the wafer burn-in test circuit 101 can include a wafer burn-in test mode block 500 and a refresh period signal generating unit 100. The wafer burn-in test mode block 500 can include an address toggle signal generating unit 200, a reset signal generating unit 300 and a refresh test mode signal generating unit 400.

The address toggle signal generating unit 200 can be configured to receive arbitrary address signals 'A<0:3>' and produce an address toggle signal 'WATD'.

The reset signal generating unit 300 can be configured to receive the address signal 'A<0:3>' and a wafer burn-in test mode activation signal 'TM_WBI' and then produce a reset signal 'RESET'.

The refresh test mode signal generating unit 400 can be configured to produce a refresh test mode signal 'TM_AREFW' in response to the toggle signal 'WATD' and the reset signal 'RESET'.

The refresh period signal generating unit 100 can be configured to receive the address toggle signal 'WATD', the refresh test mode signal 'TM_AREFW' and a normal refresh period signal 'REF' and then produces a refresh period signal 'PSRFZ'.

More detailed description will be illustrated referring to the accompanying drawings.

Figure 2:
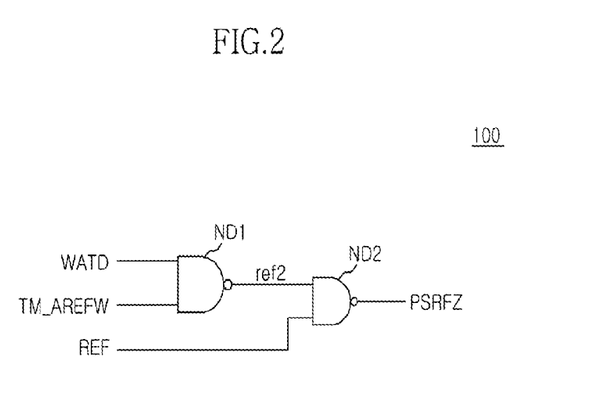
FIG. 2 is a circuit diagram illustrating a refresh period signal generating unit included in the burn-in test circuit of FIG. 1.

FIG. 2 is a circuit diagram illustrating the refresh period signal generating unit 100 of FIG. 1 in more detail. Referring to FIG. 2, the refresh period signal generating unit 100 can include first and second NAND gates ND1 and ND2 as first and second signal generating units.

In more detail, the refresh period signal 'PSRFZ' can be produced in response to the normal refresh period signal 'REF' having a constant time period, which is received by the second NAND gate ND2, or a test refresh period signal 'ref2' having a constant time period. In a normal mode, for example, the normal refresh period signal 'REF' can be a signal produced in synchronization with a refresh command from an external circuit and can have a predetermined refresh period through a refresh counter.

Meanwhile, according to one embodiment, the test refresh period signal 'ref2' can be produced in response to the refresh test mode signal 'TM_AREFW', which is received by the first NAND gate ND1, and the address toggle signal 'WATD'. The test refresh period signal 'ref2' can be produced with a time period of the address toggle signal 'WATD', which is received during an activation portion of the refresh test mode signal 'TM_AREFW'. However, the test refresh period signal 'ref2' can be 180° out of phase with the address toggle signal 'WATD'.

It is not necessarily important that these signals be out of phase with each other; however, this has a significance in that an activation portion of the refresh test mode signal 'TM_AREFW' can be configured to produce the refresh period signal 'PSRFZ' in the wafer burn-in mode and the test refresh period signal 'ref2' having a predetermined period can be produced to apply the dynamic stress to the word lines during such activation portion.

That is, according to one embodiment, the refresh period signal 'PSRFZ' can be produced by the normal refresh period signal 'REF' based on the refresh command in the normal mode. Furthermore, the refresh period signal 'PSRFZ' can be produced by the test refresh period signal 'ref2' during the predetermined period in the wafer burn-in mode. Accordingly, since the refresh period signal 'PSRFZ' is generated in response to the address toggle signal 'WATD', the time period of the dynamic stress can be determined by using the address toggle signal 'WATD', which has an appropriate period in applying the dynamic stress to the word lines. This operation will be described in detail referring the accompanying drawings.

Figure 3A:
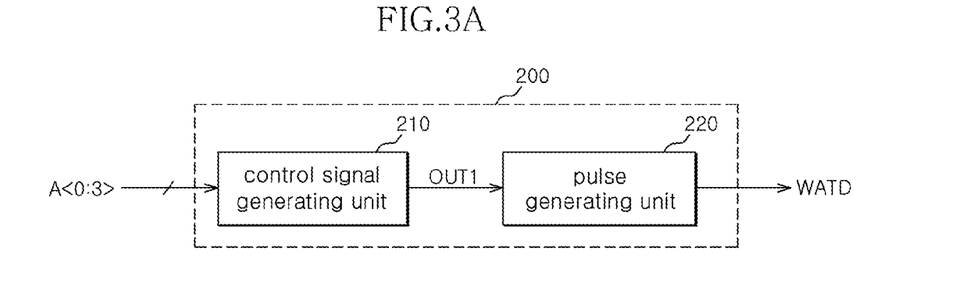
FIGS. 3A to 3C are block and circuit diagrams illustrating an address toggle signal generating unit included in the burn-in test circuit of FIG. 1.
Figure 3B:
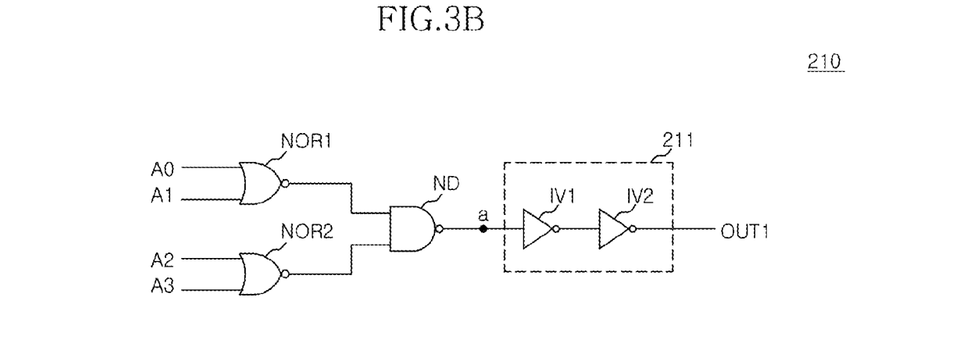
Figure 3C:
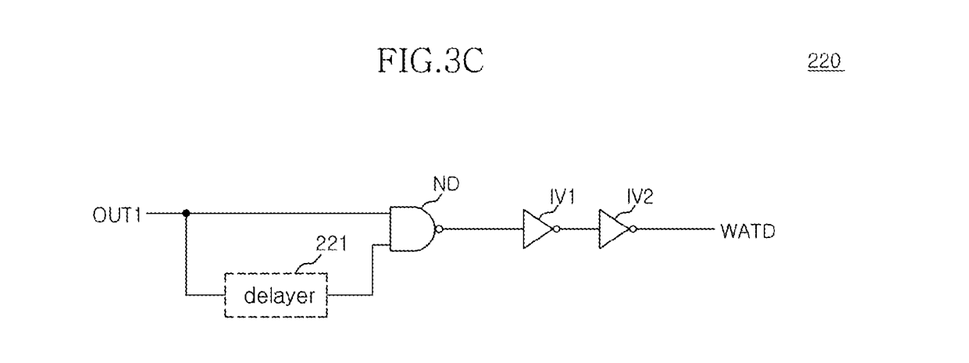

FIG. 3A is a block diagram illustrating the address toggle signal generating unit 200 in more detail and FIGS. 3B and 3C are circuit diagrams illustrating a control signal generating unit 210 and a pulse generating unit 220 in more detail. Referring to FIGS. 3A to 3C, the generation of the address toggle signal 'WATD' will be described in detail.

The address toggle signal generating unit 200 can include a control signal generating unit 210 and a pulse generating unit 220.

The address toggle signal generating unit 200 can be configured to generate a control signal 'OUT1' by receiving the address signal 'A<0:3>' and also generates the address toggle signal 'WATD' in response to the control signal 'OUT1'.

The control signal generating unit 210 can include first and second NOR gates NOR1 and NOR2, a NAND gate ND and a delayer 211. The delayer 211 can include first and second inverters IV1 and IV2.

The control signal generating unit 210 can be configured to provide the control signal 'OUT1' in response to one of the address signals 'A<0:3>', which are periodically transited, i.e., periodically toggled. Here, the plurality of the address signals 'A<0:3>' are, but not limited to, address signals that can determine a test mode capable of carrying out various tests.

In the control signal generating unit 210, the first NOR gate NOR1 can be configured to receive and combine the first and second address signals A0 and A1. The second NOR gate NOR2 can be configured to receive and combine the third and fourth address signals A2 and A3. The NORed signal produced by the first and second NOR gates NOR1 and Nor2 can be input into the NAND gate ND. A signal on node "a", which is NORed by the NAND gate ND, can be output as the control signal 'OUT1' via the delayer 211.

For convenience of illustration, it can be assumed that the control signal generating unit 210 receives the first to third address signals 'A<0:2>' of the address signals 'A<0:3>' with a constant time period. In other words, the first to third address signals 'A<0:2>' are not out of phase with each other. For instance, the first to third address signals 'A<0:2>' can have the same period of 100 ns and the same phase. However, the first address signal 'A0' can be a toggle signal having, but not limited to, a period of 100 ns and the second and third address signals 'A<1:2>' can be fixed high level signals or fixed low level signals. That is, if there is a main signal toggled in a constant time period and there are other signals that do not have an effect on the toggle signal (or have a constant time period), then these signals can be used according to the methods described herein.

Meanwhile, according to one embodiment, the fifth address signal 'A4' is, for example, a reset determination signal configured to determine a reset mode and is inactivate in a low level at an initial state.

The control signal generating unit 210 is exemplarily illustrated in such a manner that it receives and replies to the first to third address signals 'A<0:2>' having the same time period and phase and the fifth address signal 'A4', which is inactivate in a low level. However, as mentioned above, control signal generating unit 210 can be configured to reply to one of the first to third address signals 'A<0:2>'.

Referring to FIG. 3B, in the control signal generating unit 210, an inverted signal issued by the first and second address signals 'A<0:1>' can be provided to an output terminal of the first NOR gate NOR1 through a NOR operation. An inverted signal of the third address signals 'A2' can be provided, by means of the fourth address signal 'A3', which is inactivate, to an output terminal of the second NOR gate NOR2 through a NOR operation. When the output signals of the first and second NOR gates NOR1 and NOR2 are received by the NAND gate ND, a signal, which has the same period and phase as the first to third address signals 'A<0:2>', is produced on node "a" through the NAND operation.

Accordingly, the control signal 'OUT1' can be provided in response to one of the first to third address signals 'A<0:2>'.

The pulse generating unit 220 can be configured to receive the control signal 'OUT1' and produce a pulse signal. As shown in FIG. 3C, the pulse generating unit 220 can include a delayer 221, a NAND gate ND, and a plurality of inverters IV1 and IV2.

First, the NAND gate ND can be configured to perform the NAND operation of the control signal 'OUT1' and an inverted/delayed control signal from the delayer 221. An output signal of the NADN gate ND can be output, as the address toggle signal 'WATD', through the plurality of inverters IV1 and IV2. Here, the number of delayers and the size thereof can be modified based on the pulse width of the address toggle signal 'WATD'. That is, the pulse generating unit 220, which receives the control signal 'OUT1', can be designed to produce a pulse signal, which has a predetermined pulse width and has the same time period as the control signal 'OUT1'.

According to one embodiment, the address toggle signal 'WATD' can be produced in response to one of the address signals 'A<0:2>', which are input with a time period, among the first to fourth address signals 'A<0:3>' and can be a toggle signal that has a predestined pulse width (I) and has the same time period as the periodic signal.

Next, the generation of the reset signal 'RESET' using the plurality of address signals 'A<0:3>' will be described in detail.

Figure 4A:
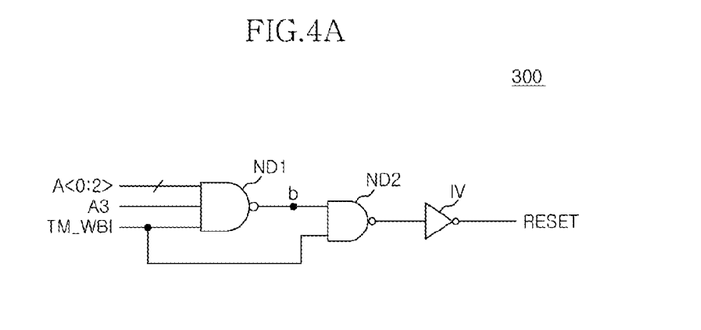
FIG. 4A is a block diagram illustrating a reset signal generating unit according to one embodiment.
Figure 4B:
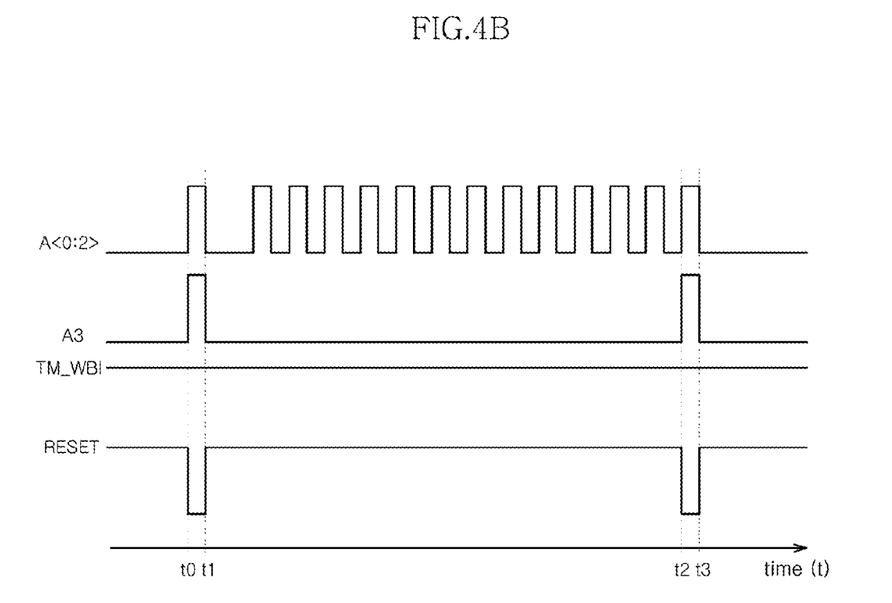
FIG. 4B is a timing chart showing the operation of the reset signal generating unit of FIG. 4A.

FIG. 4A is a circuit diagram illustrating the reset signal generating unit 300 in accordance with one embodiment, and FIG. 4B is a timing chart of the reset signal generating unit 300 of FIG. 4A.

First, referring FIG. 4A, the reset signal generating unit 300 can include first and second NAND gates ND1 and ND2 and an inverter IV.

The reset signal generating unit 300 can be configured to produce the reset signal 'RESET', and to receive the first to third address signals 'A<0:2>', the fourth address signal 'A3' and a wafer burn-in test mode activation signal 'TM_WBI'.

The first NAND gate ND1 can receive the first to third address signals 'A<0:2>', the fourth address signal 'A3' and the wafer burn-in test mode activation signal 'TM_WBI'. At this time, the wafer burn-in test mode activation signal 'TM_WBI' can be activated in a high level in the wafer burn-in mode. The fourth address signal 'A3', which can determine the reset mode, can be activated in the reset mode. For example, when it is required to reset the wafer burn-in test mode or other activation test modes, the fourth address signal 'A3' can be used for the reset operation.

The second NAND gate ND2 can be configured to perform a NADN operation of an output signal of the first NAND gate ND1 and the wafer burn-in test mode activation signal 'TM_WBI' and then output the NANDed signal to the inverter IV.

The operation of the reset signal generating unit 300 will be described in the wafer burn-in test mode. In case of the wafer burn-in test mode, the wafer burn-in test mode activation signal 'TM_WBI' is activated in a high level.

On the other hand, as mentioned above, the first to third address signals A<0:2> having the same period are inputted one of the input terminals of the first NAND gate DN1. The fourth address signal A3, which has an activated high level section to determine the reset mode, is inputted to another of the input terminals of the first NAND gate DN1. While a high level are applied to all the input terminals, a low level is provided on node "b" because of the NAND operation of the first NAND gate ND1. The second NAND gate ND2 also receives the wafer burn-in test mode activation signal TM_WBI of a high level and the low level on node "b". The activated reset signal RESET is produced by inverting an output signal of the second NAND gate ND2 via the inverter IV.

Meanwhile, in case of no wafer burn-in test mode, the wafer burn-in test mode activation signal TM_WBI is provided as an inactivated low level signal. Therefore, the reset signal RESET of a low level is provided through the NAND operations of the first and second NAND gates ND1 and ND2 to receive the wafer burn-in test mode activation signal TM_WBI of a low level.

As mentioned above, during the wafer burn-in test mode section, the reset signal generating unit 300 provides the reset signal RESET, which is activated in a low level, while the fourth address signal A3 used as a reset address signal to determine the reset is activated in a high level. Meanwhile, in case of no wafer burn-in test mode, the reset signal generating unit 300 provides the reset signal RESET, which is in a low level, in response to an inactivation of the wafer burn-in test mode activation signal TM_WBI.

FIG. 4B is a timing chart showing an operation of the reset signal generating unit 300.

The time section of t0 to t1 will be described.

As mentioned above, it is assumed that the first to third address signals A<0:2> has the same period and the fourth address signal A3 is used as the reset determination address signal. Also, it is assumed that the wafer burn-in test mode is continuously activated.

The reset signal RESET having the activation section of a low level is provided in response to the activation level of the fourth address signal A3 to be used as the reset determination address signal. The previously executed test mode is reset in synchronization with this reset signal RESET, i.e., being triggered by a falling edge of the reset signal RESET.

The time section of t0 to t2 will be described.

The reset signal RESET having the inactivation section of a high level is provided in response to an inactivation level of the fourth address signal A3 used as the reset determination address signal. That is, during this section, the previously executed test mode is continuously executed because the reset signal RESET is in an inactivation.

In the time section of t2 to t3, since the fourth address signal A3 used as the reset determination address signal is activated as described in the time section of t0 to t1, the reset signal RESET is activated in a low level. Accordingly, the previously executed test mode can be reset in synchronization with the activation of the reset signal RESET.

Figure 5A:
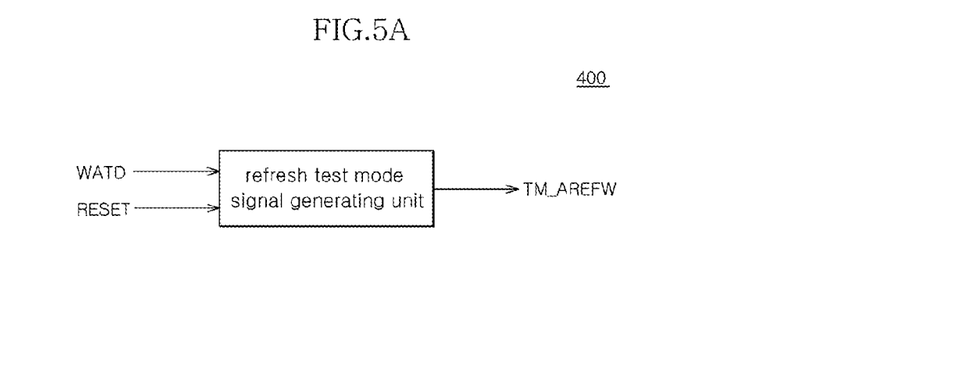
FIG. 5A is a block diagram illustrating a refresh test mode signal generating unit according to one embodiment.
Figure 5B:
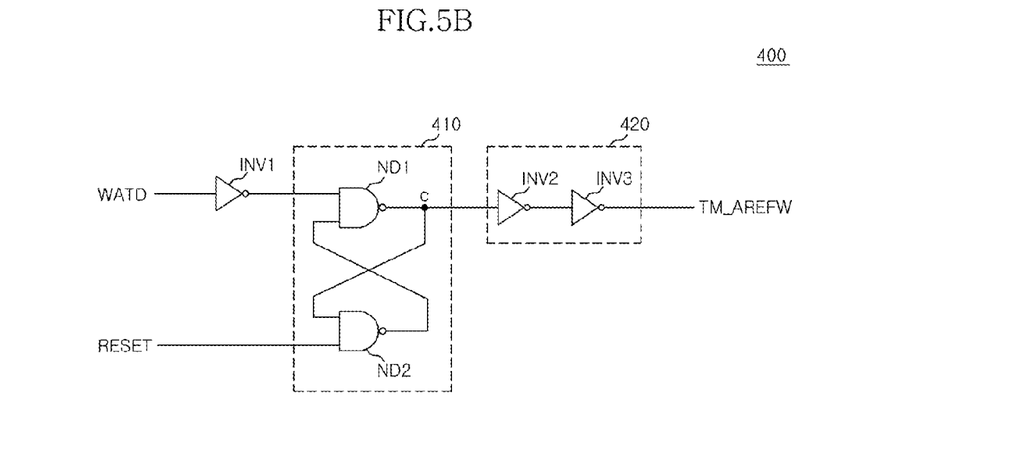
FIG. 5B is a circuit diagram illustrating the refresh test mode signal generating unit of FIG. 5A in more detail.
Figure 5C:
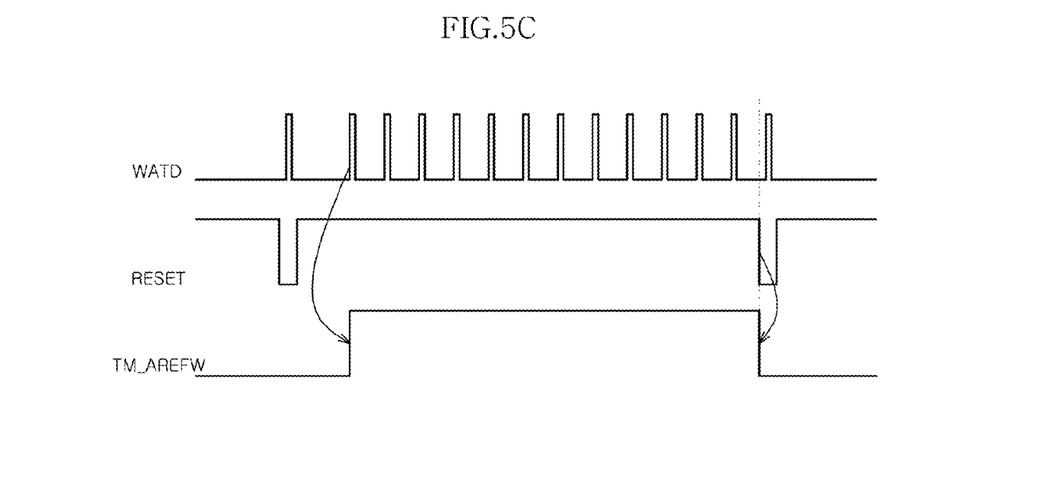
FIG. 5C is a timing chart showing the operation of the refresh test mode signal generating unit of FIG. 5B.

FIG. 5A is a block diagram illustrating the refresh test mode signal generating unit 400, FIG. 5B is a circuit diagram illustrating the refresh test mode signal generating unit 400 of FIG. 5A, and FIG. 5C is a timing chart showing an operation of the refresh test mode signal generating unit 400.

Referring to FIGS. 5A and 5B, the refresh test mode signal generating unit 400 produces a refresh test mode signal TM_AREFW in response to the address toggle signal WATD and the reset signal RESET.

The refresh test mode signal generating unit 400 includes a flip-flop 410 and a delayer 420.

First, the flip-flop 410 is a NAND-type flip-flop, including first and second NAND gates ND1 and ND2. The delayer 420 includes second and third inverters INV2 and INV3.

The first NAND gate ND1 receives an inverted signal of an address toggle signal WATD through a first inverter INV1. If the address toggle signal WATD of a high level is provided, a low level is inputted into the first NAND gate ND1 through the first inverter INV1. Accordingly, a high level is applied to node "c" which is connected to an input terminal of the second NAND gate ND2. A case where the reset signal RESET is inactivated in a high level will be illustrated below. In this case, the second NAND gate ND2 provides a low level signal and node "c" latches the high level through the NAND operation of the first NAND gate ND1 to receive the low level. The signal on node "c" is provided as the refresh test mode signal TM_AREFW of a high level via the delayer 420.

However, when the reset signal RESET, which is maintained in inactivated high level, is transited to an activated low level, a high level is provided to an input terminal of the first NAND gate ND1 through the NAND operation of the second NAND gate ND2. The first NAND gate ND1 receives inverted signals of the address toggle signal WATD and a high level. The flip-flop 410 latches the low level on node "c" in response to the low level of the address toggle signal WATD. Accordingly, the refresh test mode signal TM_AREFW is provided as a low level signal, by latching the address toggle signal WATD in a low level in response to the activation of the reset signal RESET.

In other words, the refresh test mode signal generating unit 400 provides the refresh test mode signal TM_AREFW of a high level in response to a high level of the address toggle signal WATD until the activated reset signal RESET is received. Thereafter, when the refresh test mode signal generating unit 400 receives the activated reset signal RESET, the refresh test mode signal generating unit 400 provides the refresh test mode signal TM_AREFW of the low level in response to a low level of the address toggle signal WATD.

Referring to FIG. 5C, the refresh test mode signal TM_AREFW is activated in a high level in response to a high level of the address toggle signal WATD which is received after the reset signal RESET is activated. The refresh test mode signal TM_AREFW is transited from a high level to a low level by latching a low level of the address toggle signal WATD in response to the activation of the reset signal RESET.

Figure 6:
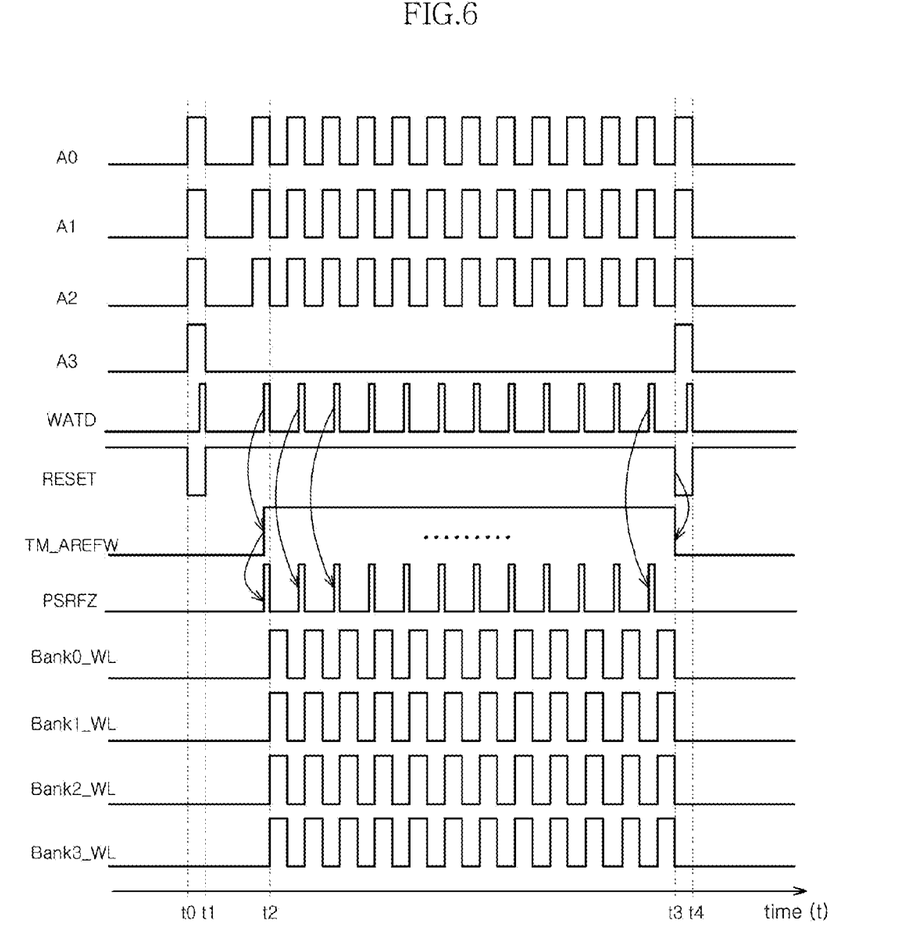
FIG. 6 is a timing chart showing the operation of the burn-in test circuit of FIG. 1.

FIG. 6 is a timing chart showing an operation of the burn-in test circuit according to one embodiment of the present invention.

Referring to FIGS. 1 to 6, the first to third address signals A<0:2> of the plurality of the address signals A<0:3> are provided with the same phase and period. Meanwhile, as mentioned above, the fourth address signal A3 can be used as the reset determination signal.

The address toggle signal WATD is produced with a predetermined pulse width in response to the first to third address signals A<0:2>.

In the wafer burn-in test mode, when all the first to fourth address signals A<0:3> are in a high level as shown in the time section of t0 to t1, the reset signal RESET of a low level is provided based on the reset determination address signal. i.e., the fourth address signal A3. The previously executed test mode is reset by this reset signal RESET.

In the time section of t0 to t2, as mentioned above, the refresh test mode signal TM_AREFW is activated, being triggered by a rising edge of the address toggle signal WATD which is activated after the reset signal RESET is activated. During the time section of t2 to t3, the activation of the refresh test mode signal TM_AREFW is maintained (by the reference numeral 410 in FIG. 5B).

That is, the refresh test mode signal TM_AREFW, which is activated during a predetermine time section in which a dynamic stress is applied to the word lines, can be produced. While the refresh test mode signal TM_AREFW is activated, the refresh period signal PSRFZ can be produced in response to the address toggle signal WATD.

This refresh period signal PSRFZ can drive all the word lines in each of banks Bank0 to bank3 (four banks are illustrated exemplarily). As a result, during the time section of t2 to t3, the dynamic stress is effectively applied to the word lines through the repetition of the active and precharge states in a time period of the refresh period signal PSRFZ.

In the conventional wafer burn-in mode, the static stress of thigh temperature and high voltage can be applied to the word lines in a state where the word lines are activated. However, according to one embodiment of the present invention, the dynamic stress can be applied to the word lines by producing the refresh period signal PSRFZ in response to the address toggle signal WATD in the wafer burn-in mode. That is, as if a package burn-in test is carried out, the dynamic stress is available to the wafer burn-in test mode, by proving the repetition of the active and precharge states to the word lines in the memory cells.

When the activated reset signal RESET is received in the time section of t3 to t4, the refresh test mode signal TM_AREFW is transited to a low level and then is inactivated, being triggered by a falling edge of the reset signal RESET. Therefore, the execution of the test mode is reset. That is, the repeated operation of the stress application, in which the word lines are activated or inactivated, is stopped.

As apparent from the above, the word lines in all the banks are repeatedly activated and inactivated by producing the refresh period signal for the dynamic stress application in the wafer burn-in test mode. That is, the address toggle signal, as an address signal of which the logic level is transited with a desired period, is produced. Then, the refresh test mode signal, which is activated in response to the address toggle signal and is inactivated in response to the reset signal, is produced. Accordingly, the dynamic stress can be applied to the word lines in all the banks, by producing the refresh period signal which has the same period as the address toggle signal while the refresh test mode signal is activated. Furthermore, in the wafer burn-in test mode, the early defectiveness can be effectively screened at the wafer state, by applying the dynamic stress through the repetition of the activation and inactivation in the predetermined period as well as by applying the normal stress.

While the present invention has been described with respect to the particular embodiments, it will be apparent to those skilled in the art that various changes and modifications may be made without departing from the spirit and scope of the invention as defined in the following claims.

What is claimed is:

1. A wafer burn-in test circuit comprising:
an address toggle signal generating unit for generating an address toggle signal in response to address signals having a constant time period;
a reset signal generating unit for receiving a wafer burn-in mode activation signal, the address signals, and a reset determination signal among the address signals and then generating a reset signal;
a refresh test mode signal generating unit for receiving the address toggle signal and the reset signal and then generating a refresh test mode signal; and
a refresh period signal generating unit for receiving the address toggle signal and the refresh test mode signal and then generating a refresh period signal.

2. The wafer burn-in test circuit of claim 1, wherein the address toggle signal generating unit comprises:

a control signal generating unit for generating a control signal by receiving the address signals; and a pulse generating unit for generating the address toggle signal having a pulse width in response to the control signal.

3. The wafer burn-in test circuit of claim 2, wherein the control signal generating unit generates the control signal, which has a same period as the address signals, in response to a time period of the address signals.

4. The wafer burn-in test circuit of claim 2, wherein the pulse generating unit comprises a delayer.

5. The wafer burn-in test circuit of claim 1, wherein the reset signal generating unit generates the reset signal in synchronization with the reset determination signal, which is activated while the wafer burn-in mode activation signal is activated.

6. The wafer burn-in test circuit of claim 5, wherein the wafer burn-in mode activation signal is activated in a high level while a wafer burn-in mode is activated.

7. The wafer burn-in test circuit of claim 1, wherein the refresh test mode signal generating unit includes a flip-flop for latching a voltage level of the address toggle signal in response to voltage levels of the address toggle signal and the reset signal.

8. The wafer burn-in test circuit of claim 1, wherein the refresh test mode signal generating unit has the refresh test mode signal activated in response to a first level of the address toggle signal until the reset signal is received and wherein the refresh test mode signal generating unit has the refresh test mode signal inactivated in response to a second level of the address toggle signal when the reset signal is activated and received.

9. The wafer burn-in test circuit of claim 1, wherein the refresh period signal generating unit comprises a normal refresh period signal and wherein the refresh period signal generating unit comprises:

a first signal supplying unit for generating a test refresh period signal in response to the address toggle signal and the refresh test mode signal; and a second signal supplying unit for generating the refresh period signal in response to the normal refresh period signal or the test refresh period signal.

10. The wafer burn-in test circuit of claim 9, wherein the refresh period signal generating unit generates the refresh period signal, which has a same period as the address signals, by replying to the address toggle signal while the refresh test mode signal is activated.

11. The wafer burn-in test circuit of claim 5, wherein the normal refresh period signal is produced by a refresh command from an external circuit.

12. A wafer burn-in test circuit comprising a refresh period signal generating unit for generating a refresh period signal which is in response to an address toggle signal while a refresh test mode signal is activated, by receiving the address toggle signal, which is in response to address signals having a constant time period, and the refresh test mode signal to define a refresh test mode section in response to the address toggle signal.

13. The wafer burn-in test circuit of claim 12, wherein the refresh period signal generating unit comprises a normal refresh period signal and wherein the refresh period signal generating unit comprises:

a first signal supplying unit for generating a test refresh period signal in response to the address toggle signal and the refresh test mode signal; and a second signal supplying unit for generating the refresh period signal in response to the normal refresh period signal or the test refresh period signal.

14. The wafer burn-in test circuit of claim 13, wherein the test refresh period signal is generated with a same time period of the address toggle signal, by replying to the address toggle signal, while the refresh test mode signal is activated.

15. The wafer burn-in test circuit of claim 13, wherein the normal refresh period signal is produced by a refresh command from an external circuit.

16. The wafer burn-in test circuit of claim 12, wherein the refresh test mode signal is maintained in an activation state in response to the address toggle signal and is inactivated in response to a reset signal which is preset to reset a test mode.

17. A wafer burn-in test circuit comprising:

a wafer burn-in test mode block for defining an activation section of a refresh test mode signal by combining an address toggle signal having a constant time period and a reset signal which is preset to reset a test mode; and a refresh period signal generating unit for generating a refresh period signal in response to a time period of the address toggle signal in the activation section of the refresh test mode signal and for generating the refresh period signal in response to a normal refresh period, which is correspondent to a refresh command, in an inactivation section of the refresh test mode signal.

18. The wafer burn-in test circuit of claim 17, wherein the wafer burn-in test mode block comprises:

an address toggle signal generating unit for generating the address toggle signal in response to address signals having a constant time period; and a refresh test mode signal generating unit for receiving the address toggle signal and the reset signal and then generating the refresh test mode signal.

19. The wafer burn-in test circuit of claim 18, wherein the refresh test mode signal is activated in response to the address toggle signal while the reset signal is inactivated and is activated in response to an activation of the reset signal.

20. The wafer burn-in test circuit of claim 17, wherein the refresh period signal generating unit comprises:

a first signal supplying unit for generating a test refresh period signal in response to the address toggle signal and the refresh test mode signal; and a second signal supplying unit for generating the refresh period signal in response to the normal refresh period signal or the test refresh period signal.

21. A wafer burn-in test circuit comprising a refresh period signal generating unit for controlling word lines in such a manner that active and precharge operations are repeatedly carried out by using a periodically toggled address toggle signal generated in response to address signals having a constant time period in a wafer burn-in mode.

22. The wafer burn-in test circuit of claim 21, wherein the refresh period signal generating unit generates the refresh period signal in response to the address toggle signal in the wafer burn-in mode and generates the refresh period signal in response to a normal refresh period which is correspondent to a refresh command in a normal mode.

23. The wafer burn-in test circuit of claim 22, wherein further comprising a reset signal which is preset to reset a test mode in the wafer burn-in mode, wherein the refresh period signal generating unit includes:

a first signal supplying unit for generating a test refresh period signal during a test mode section which is activated in response to the address toggle signal and the reset signal; and a second signal supplying unit for generating the refresh period signal in response to the normal refresh period signal or the test refresh period signal.

24. The wafer burn-in test circuit of claim 23, wherein refresh operations of all banks are controlled in a normal mode by providing the normal refresh period signal as the refresh period signal through the second signal supplying unit and wherein active and precharge operations are repeatedly carried out in all the banks in the wafer burn-in mode by providing the test refresh period signal as the refresh period signal through the second signal supplying unit.

* * * * *